United States Patent
Keene et al.

(10) Patent No.: US 10,809,316 B2
(45) Date of Patent: Oct. 20, 2020

(54) SECURITY SYSTEM OF DETECTING CONTRABAND ITEMS

(71) Applicant: Metrasens Limited, Malvern, Worcestershire (GB)

(72) Inventors: Mark N. Keene, Malvern (GB); Andrew M. Best, Malvern (GB); Daniel J. Becker, Lisle, IL (US)

(73) Assignee: Metrasens Limited, Malvern (GB)

( * ) Notice: Subject to any disclaimer, the term of this patent is extended or adjusted under 35 U.S.C. 154(b) by 0 days.

(21) Appl. No.: 16/169,948

(22) Filed: Oct. 24, 2018

(65) Prior Publication Data
US 2019/0128973 A1 May 2, 2019

Related U.S. Application Data

(62) Division of application No. 13/475,866, filed on May 18, 2012.

(51) Int. Cl.
*G01R 33/00* (2006.01)
*G01V 3/08* (2006.01)

(52) U.S. Cl.
CPC ......... *G01R 33/0047* (2013.01); *G01V 3/087* (2013.01)

(58) Field of Classification Search
USPC .................. 324/243, 253; 340/551
See application file for complete search history.

(56) References Cited

U.S. PATENT DOCUMENTS

| 3,573,817 A | 4/1971 | Akers |
| 3,697,972 A | 10/1972 | Brown |
| 3,758,849 A * | 9/1973 | Susman ................ G01V 3/107 324/225 |
| 3,763,424 A | 10/1973 | Bennett, Jr. et al. |
| 3,791,983 A | 2/1974 | Maierson |

(Continued)

FOREIGN PATENT DOCUMENTS

| CN | 2172891 Y | 7/1994 |
| CN | 101383071 A | 3/2009 |

(Continued)

OTHER PUBLICATIONS

Communication pursuant to Article 94(3) EPC, dated Apr. 14, 2020, issued in corresponding European Patent Application No. 13 730 627.0, 5 pages.

*Primary Examiner* — Jay Patidar
(74) *Attorney, Agent, or Firm* — Christensen O'Connor Johnson Kindness PLLC

(57) ABSTRACT

A security screening installation system for use in a controlled environment is described. In an embodiment, a passive detector apparatus does not produce a magnetic field for detection and relies on detecting changes in the local magnetic field. The apparatus is: (i) battery powered; (ii) light enough to be hand carried by hand and set up by one person; (iii) comprises a single elongate housing; and (iv) operable between a packed state inside a protective case and a ready to use state outside of the protective case. The housing supports at least two magnetic sensors that define a gradiometer which is arranged to produce a signal indicative of an ambient magnetic field or gradient over a zone of sensitivity which extends away from the housing, wherein a size of the zone is large enough to contain a whole body of a person.

8 Claims, 6 Drawing Sheets

(56) References Cited

U.S. PATENT DOCUMENTS

| | | | |
|---|---|---|---|
| 3,971,983 A * | 7/1976 | Jaquet | G01V 3/087 324/227 |
| 4,024,468 A | 5/1977 | Hirschi | |
| 4,068,164 A | 1/1978 | Schwartz et al. | |
| 4,087,814 A | 5/1978 | Spirig | |
| 4,249,128 A | 2/1981 | Karbowski | |
| 4,334,191 A | 6/1982 | Podhrasky | |
| 4,413,232 A | 11/1983 | Most et al. | |
| 4,467,251 A | 8/1984 | Jönsson | |
| 4,472,908 A | 9/1984 | Wanzl et al. | |
| 4,488,115 A | 12/1984 | Podhrasky | |
| 4,698,937 A | 10/1987 | Kombrekke et al. | |
| 4,942,360 A | 7/1990 | Candy | |
| 4,962,473 A | 10/1990 | Crain | |
| 5,039,981 A | 8/1991 | Rodriguez | |
| 5,148,151 A | 9/1992 | Podhrasky | |
| 5,345,222 A | 9/1994 | Davies et al. | |
| 5,414,410 A | 5/1995 | Davies et al. | |
| 5,456,718 A | 10/1995 | Szymaitis | |
| 5,959,451 A | 9/1999 | De Torfino | |
| 5,996,281 A | 12/1999 | Takano et al. | |
| 6,133,829 A | 10/2000 | Johnstone et al. | |
| 6,150,810 A | 11/2000 | Roybal | |
| 6,308,644 B1 | 10/2001 | Diaz | |
| 6,342,835 B1 | 1/2002 | Nelson-White | |
| 6,541,966 B1 | 4/2003 | Keene | |
| 6,696,947 B1 | 2/2004 | Bybee | |
| 7,113,092 B2 | 9/2006 | Keene | |
| 7,296,683 B1 | 11/2007 | Vallelonga, Sr. et al. | |
| 7,408,461 B2 | 8/2008 | Fluck | |
| 7,414,404 B2 | 8/2008 | Keene | |
| 7,489,128 B2 | 2/2009 | Kopp | |
| 7,525,308 B2 | 4/2009 | Tsukada et al. | |
| 7,893,690 B2 | 2/2011 | Simon | |
| 8,450,678 B2 | 5/2013 | Sasaki et al. | |
| 2002/0148965 A1 | 10/2002 | Haufe | |
| 2003/0080868 A1 | 5/2003 | Nelson | |
| 2003/0171669 A1 * | 9/2003 | Kopp | G01V 3/08 600/410 |
| 2004/0041084 A1 | 3/2004 | Carlson | |
| 2004/0080315 A1 | 4/2004 | Beevor et al. | |
| 2004/0119475 A1 * | 6/2004 | Earle | G01V 3/15 324/329 |
| 2004/0135687 A1 | 7/2004 | Keene | |
| 2004/0147833 A1 | 7/2004 | Czipott et al. | |
| 2005/0119547 A1 | 6/2005 | Shastri et al. | |
| 2005/0242817 A1 | 11/2005 | Hoult | |
| 2005/0264416 A1 | 12/2005 | Maurer | |
| 2006/0145691 A1 * | 7/2006 | Massengill | G01R 33/28 324/207.25 |
| 2006/0158331 A1 * | 7/2006 | Massengill | G01V 3/14 340/551 |
| 2006/0197523 A1 | 9/2006 | Palecki et al. | |
| 2007/0040692 A1 | 2/2007 | Smith et al. | |
| 2007/0052411 A1 | 3/2007 | McClure et al. | |
| 2007/0057786 A1 | 3/2007 | McClure et al. | |
| 2007/0132581 A1 | 6/2007 | Molyneaux et al. | |
| 2007/0133844 A1 | 6/2007 | Waehner et al. | |
| 2007/0182550 A1 | 8/2007 | Castello et al. | |
| 2007/0290843 A1 | 12/2007 | Manneschi | |
| 2007/0296576 A1 | 12/2007 | Holowick | |
| 2008/0001735 A1 | 1/2008 | Tran | |
| 2008/0080178 A1 | 4/2008 | Kita et al. | |
| 2008/0084301 A1 | 4/2008 | Roybal et al. | |
| 2008/0117044 A1 * | 5/2008 | Hibbs | G01V 3/105 340/568.1 |
| 2008/0136631 A1 | 6/2008 | Fluck | |
| 2008/0157965 A1 | 7/2008 | Shahar | |
| 2008/0231443 A1 | 9/2008 | Kotter et al. | |
| 2009/0122547 A1 | 5/2009 | Hou | |
| 2009/0167307 A1 | 7/2009 | Kopp | |
| 2009/0273340 A1 | 11/2009 | Stephanson et al. | |
| 2009/0284405 A1 | 11/2009 | Salmon et al. | |
| 2010/0013461 A1 | 1/2010 | Masubuchi et al. | |
| 2010/0156407 A1 | 1/2010 | Lausch et al. | |
| 2010/0026510 A1 | 2/2010 | Kiani et al. | |
| 2010/0156638 A1 | 6/2010 | McClure et al. | |
| 2010/0315080 A1 | 12/2010 | Duncan et al. | |
| 2010/0319256 A1 | 12/2010 | Agam et al. | |
| 2011/0057788 A1 | 3/2011 | Talkington et al. | |
| 2011/0102597 A1 | 5/2011 | Daly et al. | |
| 2011/0172953 A1 | 7/2011 | Kim | |
| 2011/0285390 A1 | 11/2011 | Jewitt et al. | |
| 2012/0038456 A1 | 2/2012 | Pikkarainen et al. | |
| 2012/0074943 A1 | 3/2012 | MacLeod et al. | |
| 2013/0187788 A1 | 7/2013 | Salter | |
| 2013/0229518 A1 | 9/2013 | Reed et al. | |
| 2013/0307533 A1 | 11/2013 | Keene et al. | |
| 2014/0232382 A1 | 8/2014 | Goodyear et al. | |
| 2014/0248833 A1 | 9/2014 | Royle et al. | |

FOREIGN PATENT DOCUMENTS

| | | |
|---|---|---|
| CN | 102682553 A | 9/2012 |
| CN | 103747725 A | 4/2014 |
| EP | 0 097 139 A2 | 12/1983 |
| GB | 2395276 A | 5/2004 |
| JP | 2006-505781 A | 2/2006 |
| JP | 2008-249584 A | 10/2008 |
| WO | 03/069320 A2 | 8/2003 |
| WO | 2008/028487 A1 | 3/2008 |
| WO | 2011/086369 A1 | 7/2011 |
| WO | 2012/022971 A2 | 2/2012 |
| WO | 2014/064429 A2 | 5/2014 |

* cited by examiner

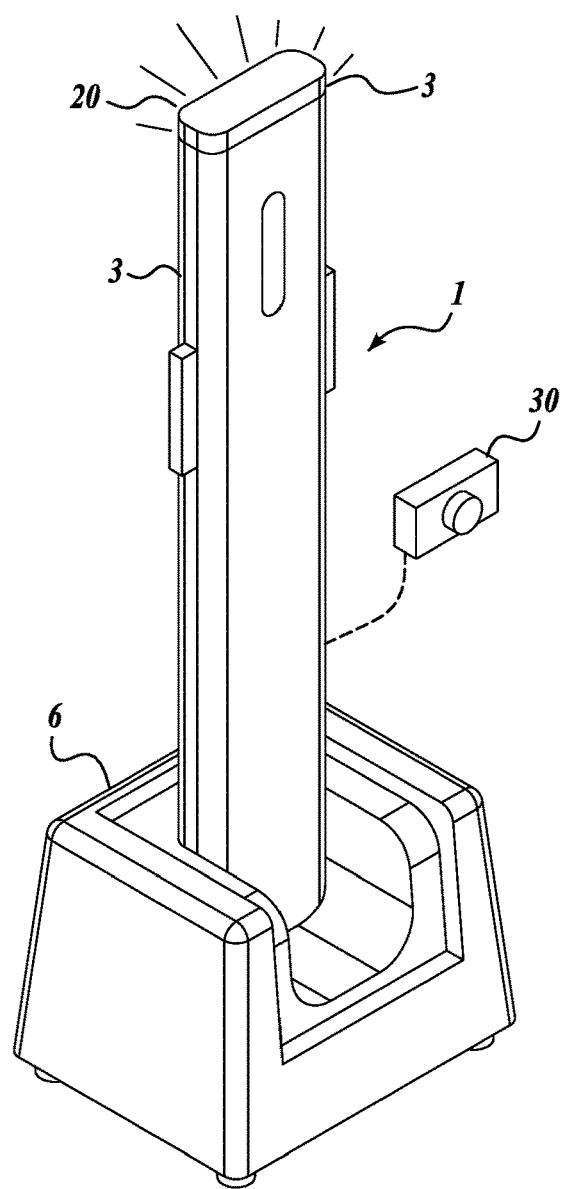
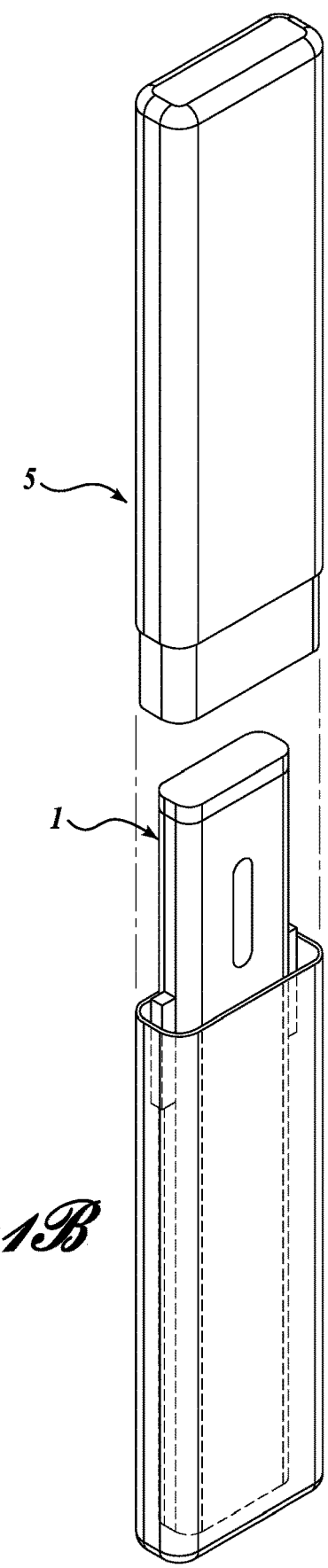
Fig.1A
Fig.1B

SECURITY SYSTEM OF DETECTING CONTRABAND ITEMS

BACKGROUND

Embodiments of the present disclosure relate to security systems and to methods of detecting contraband items. In particular in some embodiments it relates to searching for contraband items such as mobile telephones within confined environments such as prisons.

The possession of contraband items in prisons is widely recognised as a major risk to safety, either of the inmates, the prison staff, and to persons outside of the prison. In the context of this application, contraband is defined as any item which the inmate should not have in their possession and which may be used to cause harm or place a person at risk. Contraband includes knives, shanks, guns, and other weapons, many of which contain metal or magnetic parts. Cell phones are considered to be contraband and to be dangerous because they can be used by inmates to arrange violent acts inside or outside of the prison, or used to conduct other criminal activities. Using cell phones, criminals can continue to conduct organized crime whilst incarcerated. The presence of unauthorized cell phones in prisons is recognized as a large and significant problem that is important to solve. They are smuggled in using a wide variety of very ingenious methods and, once inside, they are well hidden. Inmates transport cell phones using a variety of means, but most commonly by hiding them in clothing or internally in the body. They may also be transported via the laundry system.

As such being found in possession of contraband is considered a serious offence. All prisons have in place measures to assist in the detection of these contraband items centred on the use of smart searches of prisoners and areas of the prison in order to locate the phones and confiscate them; either within the prison or preventing them getting in.

Archway metal detectors, AMDs, are commonly used in prisons. They require permanent installation at locations where the environment is conducive to their operation. Their main limitation is that they are permanently installed and overt, so there is a common awareness of them and few inmates will deliberately carry cell phones through them. They cannot be installed in areas where inmates commonly go with limited supervision due to the risk of them being damaged or destroyed. This means they cannot be used in cell blocks and common areas in particular. Also, AMDs cannot be used next to large amounts of metal which severely limits where they can be installed within the metal-rich prison environment.

A phone battery constitutes a major contribution to the signature that an AMD measures, and the removal of the battery is well known to reduce the probability of detection. Alternative means of powering phones have been devised by inmates. It is also known that carrying a phone internally reduces the probability of detection by metal detectors. These limitations often result in the use of AMDs being restricted to visitor and staff access, gates and not generally utilized within the prison itself.

Hand held metal detectors, often called hand wands, have widespread use in prisons. They are inexpensive, highly portable, and can be carried into cell blocks by prison staff and used to search inmates, bedding, laundry, etc. Their main drawback is their limited range. Because of this they are ineffective for internally carried phones. They can be effective at finding phones in clothing, but the detector needs to be scanned over all parts of the body to get coverage. This is time consuming and labour intensive, providing only a narrow advantage over manual searching.

With AMDs and hand wands an alternating or pulsed magnetic field is transmitted from a coil. The pulses induce eddy currents in the contraband, which in turn cause it to emit its own magnetic field. This weak field is then detected by another coil of the handwand. It is thought that these magnetic fields could interfere with pulse generators in heart pacemakers or neurostimulators so there is a general reluctance to scan people with such implants.

Embodiments of the present disclosure are directed to new methods and systems for detecting and locating the cell phones. In particular, the embodiments address significant gaps in the capabilities of archway and hand-held metal detectors for this application, and provide a highly increased effectiveness at cell phone detection over these traditional detection means.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

According to a first aspect, the present disclosure provides a method of detecting contraband about a person using a portable detector apparatus comprising an elongate housing that supports at least one magnetic sensor which is arranged to produce a signal indicative of an ambient magnetic field or gradient over a zone of sensitivity which extends away from the housing, the size of the zone being large enough to contain the whole body of the person, and a signal processing circuit which receives as an input the signal from the magnetic sensor and which, in response to a change in the signal, produces an alert signal; the method comprising:

Setting up the portable detector apparatus in a chosen location;

causing the person to pass alongside the housing from outside of the zone of sensitivity into the zone of sensitivity, monitoring for the issue of an alert by the device which is indicative of the possible presence of contraband.

The method may comprise, in the event of an alert being issued, performing additional security screening of the person to locate the possible contraband.

The step of additional screening may comprise sweeping the person with a hand held metal detector. It may include additionally or alternatively performing a manual body search or pat down, or a cavity search.

Using a magnetic sensor, by which we mean a sensor that can detect the presence of ferromagnetic materials, rather than a hand held wand metal detector which relies on induced magnetic fields in objects, enables screening to be carried out much quicker. Compared with a using an arch type metal detector, the screening can be carried out easily in a number of different locations because the device is portable. The person passes alongside the housing rather than through the housing (through the archway). The housing can therefore be smaller than an archway type apparatus as the zone of sensitivity is not dictated solely by the size of the housing but by the sensitivity of the sensor, the sensing circuitry and so on.

By using a zone of sensitivity large enough to contain a whole body of an inmate they can be quickly moved through the zone. The applicant has also appreciated that magnetic sensors are superior to the coils used in metal detectors at detecting items such as mobile phones, which have components that have favourable properties for magnetic detection.

The method may comprise locating the apparatus in any convenient chosen location, but preferably in a constricted area such as in a corridor or just before or after a doorway.

The method may employ a number of strategies as set out hereinafter. These strategies are especially suited to an apparatus which comprises a single pole with a zone of detection that extends away from and at least partially around the housing, a person walking alongside rather than through the apparatus. The housing will typically be at the centre of the zone, or at one edge, and the zone will therefore be zone bounded along only one opposing edge by the housing. This is distinct from a so called "archway" apparatus which includes a frame with the zone being defined between the uprights of the frame for which the strategies cannot be readily implemented. The extent of the zone with a single pole device will not be defined solely by the physical size of the pole, but by the sensitivity of the magnetic sensors and as such can be adjustable. Being adjustable helps to optimise the area within which detection is made, and reduce false alarms outside of the area.

The method may comprise positioning the detector apparatus on a first side of a wall or other obstacle such that the zone of sensitivity covers a region on the second, opposing, side of the wall or obstacle, the second side comprising the chosen location for the screening, a person within the chosen location being unable to see the apparatus. This allows for covert screening to be carried out. It cannot be achieved using an archway type detection apparatus where one part of the frame would need to be on the second side of the wall where it would be visible.

The method may comprise providing an apparatus having at least two zones of sensitivity, one on each side of the apparatus, and causing at least one person to move into a zone on one side and another person to move into the zone on the other side. In a favourable arrangement the apparatus may define a zone which extends a full 360 degrees around the housing.

The method may comprise causing a plurality of people to form two lines, and to file past each side of the apparatus substantially in parallel. Because the zone extends around the housing, a person will pass through the zone regardless of which side they walk. This cannot be achieved with an archway apparatus, where a person has to pass through the archway.

The apparatus may include a carry case, and may be operable between a packed state inside the case to a ready to use state outside of the case in less than 30 seconds. It may be light enough to be carried and set up by one person. It may be small enough to fit easily within the trunk of a passenger car.

The housing of the apparatus may comprise an elongate pole of between 4 feet and 6 feet or more in height, and may include a stand for holding the housing in a vertical orientation which enables the apparatus to be quickly and easily erected at any point where contraband detection is required. This may be a collapsible stand. It may be provided with a carry case for storage of the device prior to use and after use.

The pole may house two magnetic sensors, perhaps in line with one another, that define a gradiometer.

The device may be ruggedized so that it is capable of withstanding being pushed or pulled over in use without causing any damage to the operation of the device. This may include ruggedizing any circuitry within a housing of the detector apparatus, and/or ruggedizing the housing itself.

The magnetic sensor may comprise any one of: a fluxgate sensor, a magneto-resistive sensor, a magneto-impedance sensor, a Hall Effect sensor, and a galvanic coil sensor.

The detector apparatus is a passive device, and unlike metal detectors does not emit any radiation that might interfere with delicate electrical equipment such as cardiac pace makers.

According to a second aspect, the present disclosure may provide a security screening installation system comprising:

a detector apparatus which includes at least one magnetic sensor arranged to produce a signal indicative of an ambient magnetic field or gradient over a zone of sensitivity around the sensor, the zone being large enough to contain the whole body of the person, and a signal processing circuit which receives as an input the signal from the magnetic sensor and which, in response to a change in the signal produces an alert signal; and a wall or other object behind which the detector apparatus is hidden, the detector apparatus being positioned so that at least part of the zone of sensitivity extends in front of the wall or other object and is large enough for a person to fit wholly within the zone.

The wall may comprise a brick or concrete wall, or may be of any other material through which a magnetic field will pass relatively unimpeded. It may comprise a wall or object within a controlled environment such as a prison. It may be a corridor wall.

The detector apparatus may comprise a housing where the zone of sensitivity is defined by a region bounded at single edge by the housing and in which all other points within the region are further away from the housing. This is distinct from an archway apparatus in which the two uprights of the archway define two distinct edges of the zone. The extent of the detection zone of the present disclosure may be controlled by setting the sensitivity of the device, which again is unlike an archway device, and allows the zone to cover a desired area such as the full width of a corridor. For narrower corridors the sensitivity can be reduced, and for larger ones it can be increased. This is desirable as a minimal zone size allows operators who may be carrying metal items to stand as close as possible to the device.

According to a third aspect, the present disclosure provides a method of making safe an object which may be concealing contraband comprising:

Setting up in a fixed location a portable detector apparatus comprising a single elongate pole housing at least one magnetic sensor arranged to produce a signal indicative of an ambient magnetic field or gradient over a zone of sensitivity around the sensor, the zone being large enough to contain the whole body of the person, and a signal processing circuit which receives as an input the signal from the magnetic sensor and which, in response to a change in the signal, produces an alert signal;

causing the object to move from outside of the zone of sensitivity past the chosen location into the zone of sensitivity, and monitoring for the issue of an alert by the device which is indicative of the possible presence of contraband.

The object may comprise a laundry bag which contains laundry.

It may comprise a mattress or other bedding from an inmate's cell.

It may comprise one or more food or beverage cans, such as aluminium cans.

Use of a single pole is convenient as it enables the housing to be positioned vertically to screen upright objects, and people, or laid on the floor to screen items slid along the floor. It is quick and easy to set up compared with a bulky archway type detector, and is more robust as the housing does not need to knock-down and yet still be convenient to move from one location to the next.

According to a fourth aspect, the present disclosure provides a method of increasing safety in a controlled environment, such as a prison, comprising carrying out a series of screenings at locations within the controlled environment, the method comprising using a portable detection apparatus comprising a single elongate pole shaped housing which supports at least one magnetic sensor that is sensitive to the ambient magnetic field.

The inventive methods may be employed inside any controlled area, such as a permanent prison or even a temporarily set up prison camp or the like. It can be used to screen inmates, prison staff, visitors or any object in the prison.

DESCRIPTION OF THE DRAWINGS

The foregoing aspects and many of the attendant advantages of this disclosure will become more readily appreciated by reference to the following detailed description, when taken in conjunction with the accompanying drawings, wherein:

FIG. 1A is an isometric view of a detection apparatus;

FIG. 1B is an isometric view of a protective case for the detection apparatus of FIG. 1A;

FIG. 3A illustrates a person moving from outside of a zone of sensitivity. FIG. 3B illustrates a person inside a zone of sensitivity;

FIG. 5A illustrates an inmate moving from outside the zone of sensitivity. FIG. 5B illustrates an inmate inside the zone of sensitivity without being aware of the zone.

DETAILED DESCRIPTION

Figure 2:
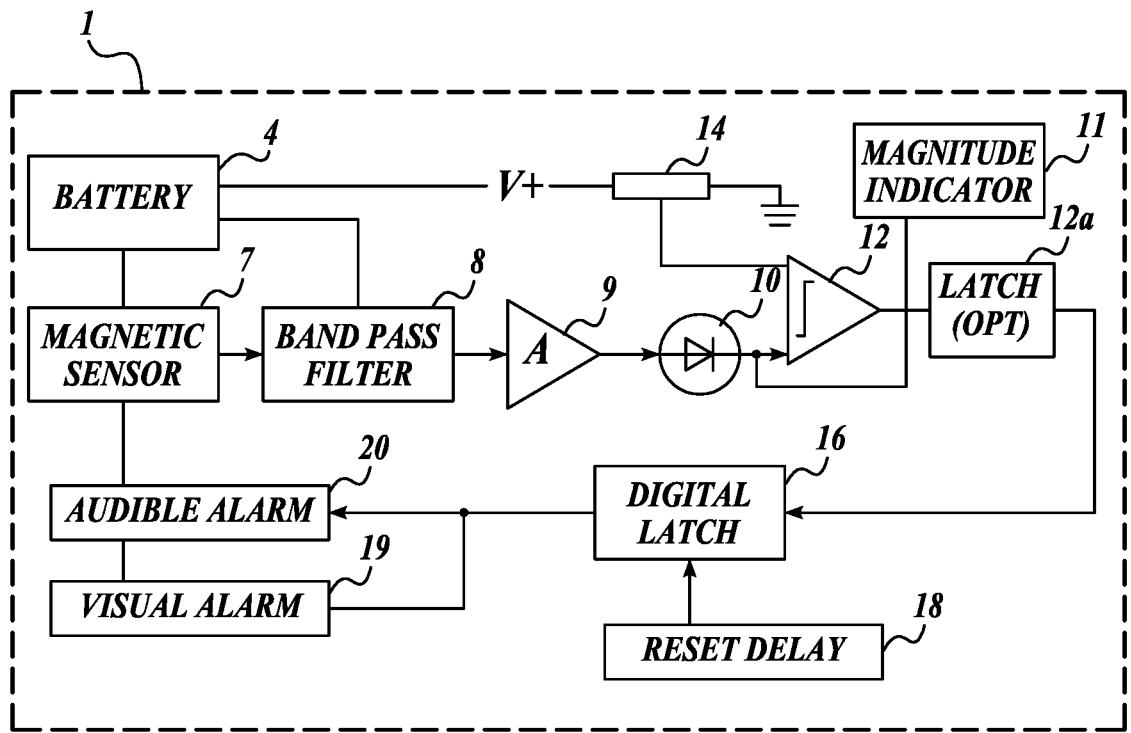
FIG. 2 is a schematic view of the detection apparatus of FIG. 1A.

FIG. 1A shows a detector apparatus 1 that may be used to carry out a method, or form part of a system or screening strategy, of the present disclosure. FIG. 2 shows the main functional parts detector apparatus in a block diagram.

The detector apparatus 1 comprises a pole shaped housing 2 made of aluminium, about 4 feet (120 cm) tall and 10 cm wide, which has a base 6 at one end and is capped at the other end with clear plastic cap 3. The cap 3 covers a set of light emitting diodes and drive circuit which form a visible alarm. The diodes are red, amber, and green and can be illuminated separately so as to provide a red, amber, or green glow. The housing 2 contains all of the electronic circuitry needed to operate the device, as described below in relation to FIG. 2, and a battery 4. The battery 4 provides power to the circuit enabling the apparatus to be self-powered and used away from a mains power source.

The apparatus is light enough to be carried around easily, and the pole containing the circuitry can be stored safely in a two part protective case 5 (see FIG. 1B). A weighted base 6 is provided which can be used to hold the pole in an upright position as shown in FIG. 1A. The pole 2 is ruggedized to protect the circuitry if it is handled roughly or knocked over.

Internally, as shown in FIG. 2, the detector apparatus 1 comprises an electronic circuit powered by the battery 4. A magnetic sensor 7 is provided, such as a fluxgate sensor or a magneto-resistive sensor, a magneto-impedance sensor, a Hall Effect sensor, or a galvanic coil sensor, which is produces an output signal dependent on the ambient magnetic flux around the sensor. In fact, two or more sensors can be used if desired, the increased number of sensors enabling a defined zone of sensitivity to be established. Where only one sensor is provided the zone will extend all around the sensor and be limited only by the sensitivity of the readout electronics, preset to define the maximum distance from the sensor at which an object can be detected. The zone extends on one side of the apparatus and is large enough to accommodate the whole of an inmate, perhaps extending for 1 metre from the pole.

When used, the apparatus generally remains still. The magnetic sensor 7 will register a largely unchanging magnetic field due to the earth and static steel objects. This constitutes a large offset on the output of the sensor. This constant offset can be removed using a high pass filter. The sensor will also likely measure regular changes in the magnetic field associated with the power supply for electrical equipment located near the detector apparatus which will cause the output to vary at the supply frequency and its harmonics. This can also be filtered out using a low pass filter. The filters collectively constitute a band-pass filter 8 to perform these functions.

It is known that it takes between 0.3 seconds and 3 seconds, typically, for a person to pass through a doorway. The reciprocal of these times defines the frequencies of interest in the output of the sensor 4, i.e., 0.3 to 3 Hz.

If a ferromagnetic object carried, or pulled or pushed, by a person passes close to the sensor 7 through the zone of sensitivity, the ambient magnetic field will be altered causing a change in the output of the magnetic sensor 7. That change will pass through the filter 8 and be amplified by an amplifier 9. In order to trigger an alarm the signal size is compared with a preset threshold. Because the signal may be positive or negative, the threshold detector consists of a rectification stage 10 followed by a comparator 12 that has a circuit 14 to provide a threshold voltage. Alternatively, separate comparators are used for positive and negative signals with the outputs combined to give a single alarm signal instead of a rectifier 10 and a single comparator 12. An optional latch 12a may be provided which holds the value of the signal output from the comparator for a predetermined period—perhaps up to 1 second.

The output of the comparator may be arranged to have logic level zero for the state where the signal does not exceed the threshold, and level 'one' for the state when the signal has exceeded the threshold. Once an object has passed out of range of the sensor 7, the logic level returns to zero, once the signal level has dropped below the threshold. In practice, it may be preferable that the alarm continues for an elapsed time defined by a reset delay 18 and a latch 16 such as a flip-flop that maintains the output at logic zero until the button is pressed.

The latch is used to trigger the visual alarm 19, glowing green at logic level zero and red at logic level one. It has been found to be beneficial, although not essential, that both a visual and audible alarm are provided. This colour change, and audible alarm, provide an indication of whether contraband is present. The detector apparatus may also include an audible alarm 20.

An optional feature is a remote alarm unit 30, which can be connected to the latch of any other suitable part of the apparatus by a wire, or wirelessly using any known communications means, such an optical link or radio signal, for example using the Bluetooth protocols, wife, mobile cellular communications network protocols and so on. This list should not be considered to be an exhaustive list and is merely a list of examples. This may produce an audible or visible alarm, or perhaps provide a haptic signal to discretely alert an operator. In some arrangements this remote alarm unit could be provided instead of an alarm on the housing.

Figure 3A:
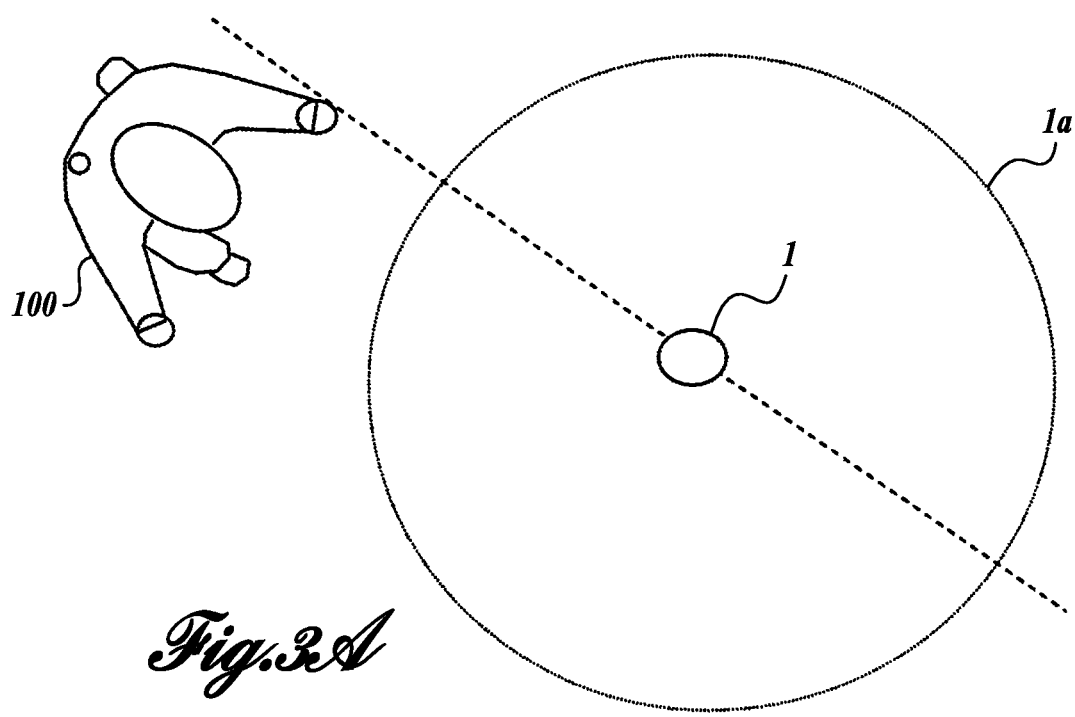
FIGS. 3A and 3B are schematic views of the location of the apparatus.
Figure 3B:
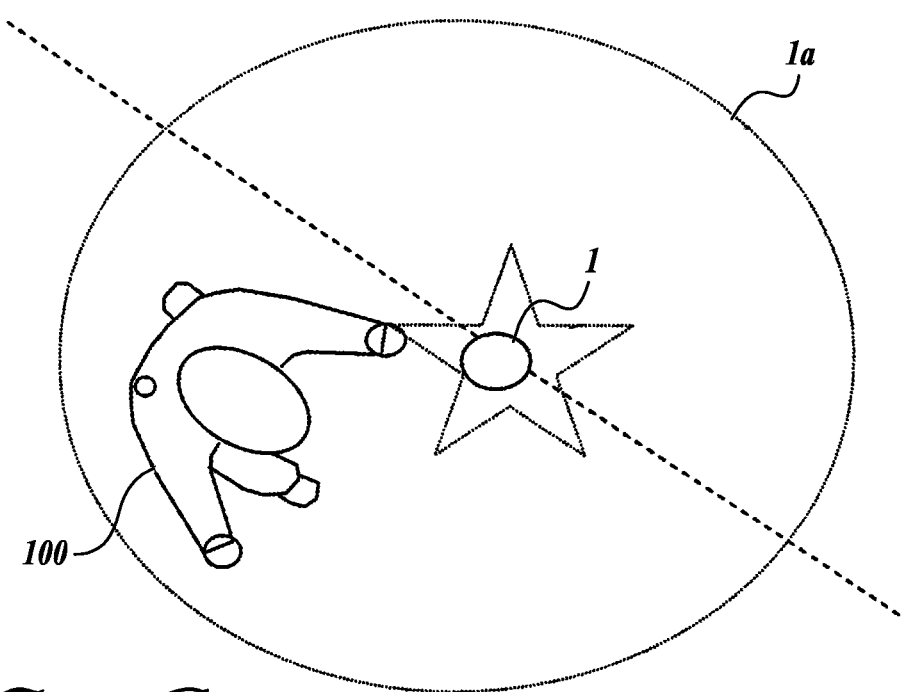

In a first embodiment of a method of use of the detector apparatus is located in a confined space in a controlled environment such as a prison as shown in FIGS. 3A and 3B of the accompanying drawings. This may be a corridor or by an entrance or exit to a room, or perhaps in an outdoor area such as an exercise yard. It is preferable that it is set up near a constriction such as a door way or corridor.

The detector apparatus 1 is initially unpacked from its case and the pole placed upright in the holder. It is then switched on, creating a zone of sensitivity around the pole as indicated by the dotted line 1a. At this time, all persons should be kept outside of the zone and the apparatus checked to ensure that a steady green visual alarm is issuing. If it is not, there may be a problem such as the pole being too close to a large metal object such as a door. It will then need to be repositioned. A test can then be carried out by bringing a metal object such as a bunch of keys into the zone of sensitivity, which should cause the visual alarm to turn red. The audible alarm will also issue.

Once erected and tested the detector apparatus is ready to be used to screen inmates for contraband. There are several strategies that can be employed, the following being just some examples of ways in which embodiments of the present disclosure can be implemented. In each case, the inmate 100 is brought into the zone of sensitivity, whereby an alarm is raised if contraband is present. Upon an alarm being raised a more detailed search can be carried out to identify exactly where the contraband is concealed about the inmate in their clothing or on or inside their body.

Strategy 1—Surprise Search

Inmates 100 approaching the device are asked to file past the detector apparatus 1 passing through the zone 1a as shown in FIG. 3B, whilst being given no opportunity to stall or to pass word back along the line. Any inmate who causes an alarm when passing is taken to one side for a more detailed check for contraband. This more detailed check may include patting down or scanning the inmate with a hand held metal detector wand. This strategy will discover contraband on the inmates if it contains material which affects a magnetic field, such as batteries, metal phone cases, metal shanks and the like.

Figure 4:
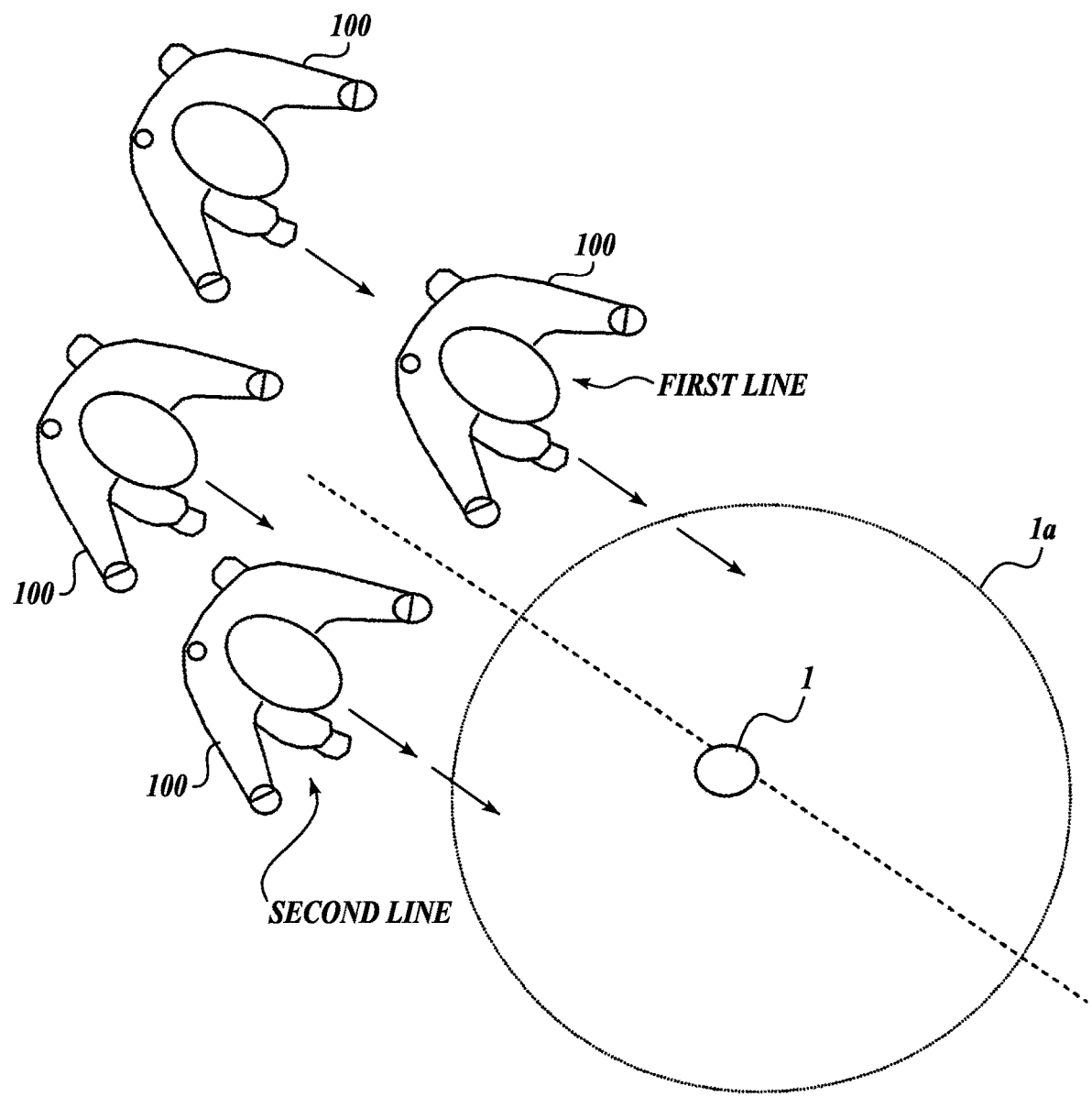
FIG. 4 is a schematic illustration of the location of the apparatus when performing a modified strategy of the method, whereby two lines of inmates move from outside of a zone of sensitivity to inside the zone, passing on both sides of the detector apparatus.

In a refinement shown in FIG. 4 the device is set up in the centre of a confined space such as a corridor, enabling inmates 100 to file past in two lines, one each side of the pole. This increases throughput and makes the screening faster and less disruptive. If a red alarm is issued, then the one or two inmates in the zone at the time are taken aside for more detailed searching.

Strategy 2—Semi Surprise Searching

Inmates 100 are initially contained in a controlled space before being filed past the device through the zone of sensitivity when leaving an area but are given the opportunity to stall and to pass word back along the line out of sight of any prison guards. Any inmate who causes an alarm when passing is taken to one side for a more detailed check for contraband. This strategy will generally cause inmates to discard contraband before approaching the detector. After all have passed the controlled space is searched for contraband that has been discarded.

Strategy 3—Covert Screening

Figure 5A:
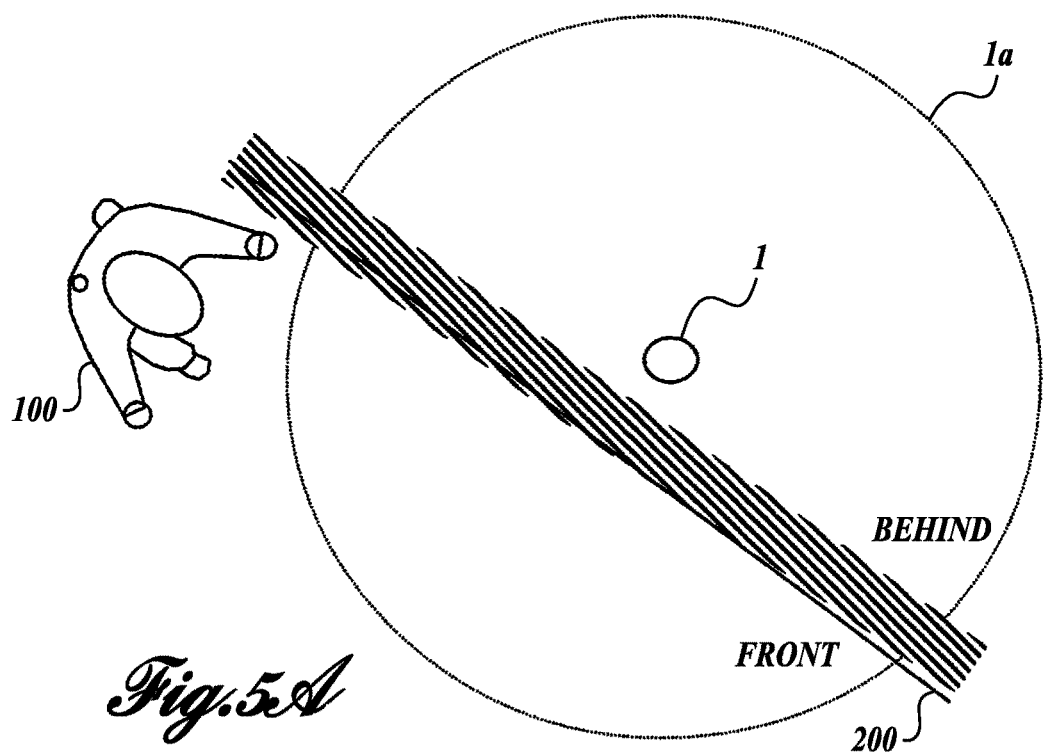
FIGS. 5A and 5B are schematic illustrations of a covert strategy where the detector apparatus is located behind a wall with the zone of sensitivity extending in front of the wall.
Figure 5B:
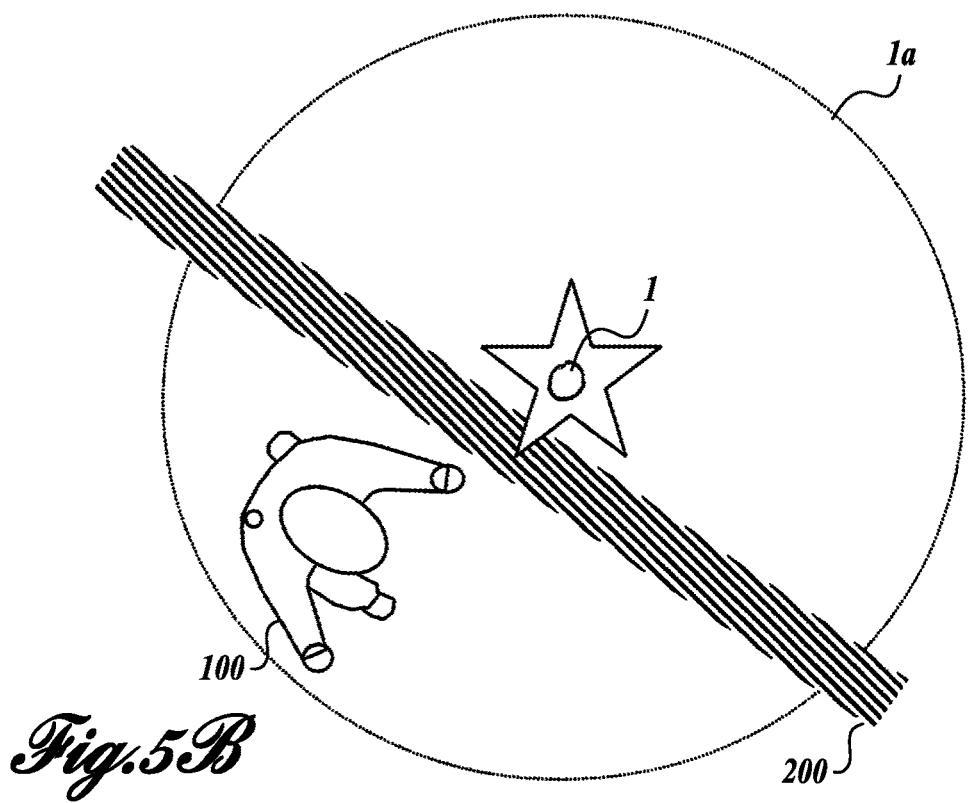

In this strategy, shown in FIGS. 5A and 5B, the detector apparatus is set up behind a wall 200 adjacent a controlled space such as a doorway or corridor. It is important that it cannot be seen by any inmate in the controlled space. The zone of sensitivity 1a includes a portion which extends through the wall 200 into the controlled space, and the inmates 100 are made to file through this zone in front of the wall. The strategy will discover contraband in the same way as strategy 1 but the inmates 100 will not be aware that they are being screened. The device can create a zone through most types of brick or concrete walls, and so this strategy can be employed in many areas of a prison. Because the device is portable and quick to set up the inmates will not learn which areas to avoid, as they would with a conventional arch detector.

Strategy 4—Laundry Bag Screening.

Figure 6:
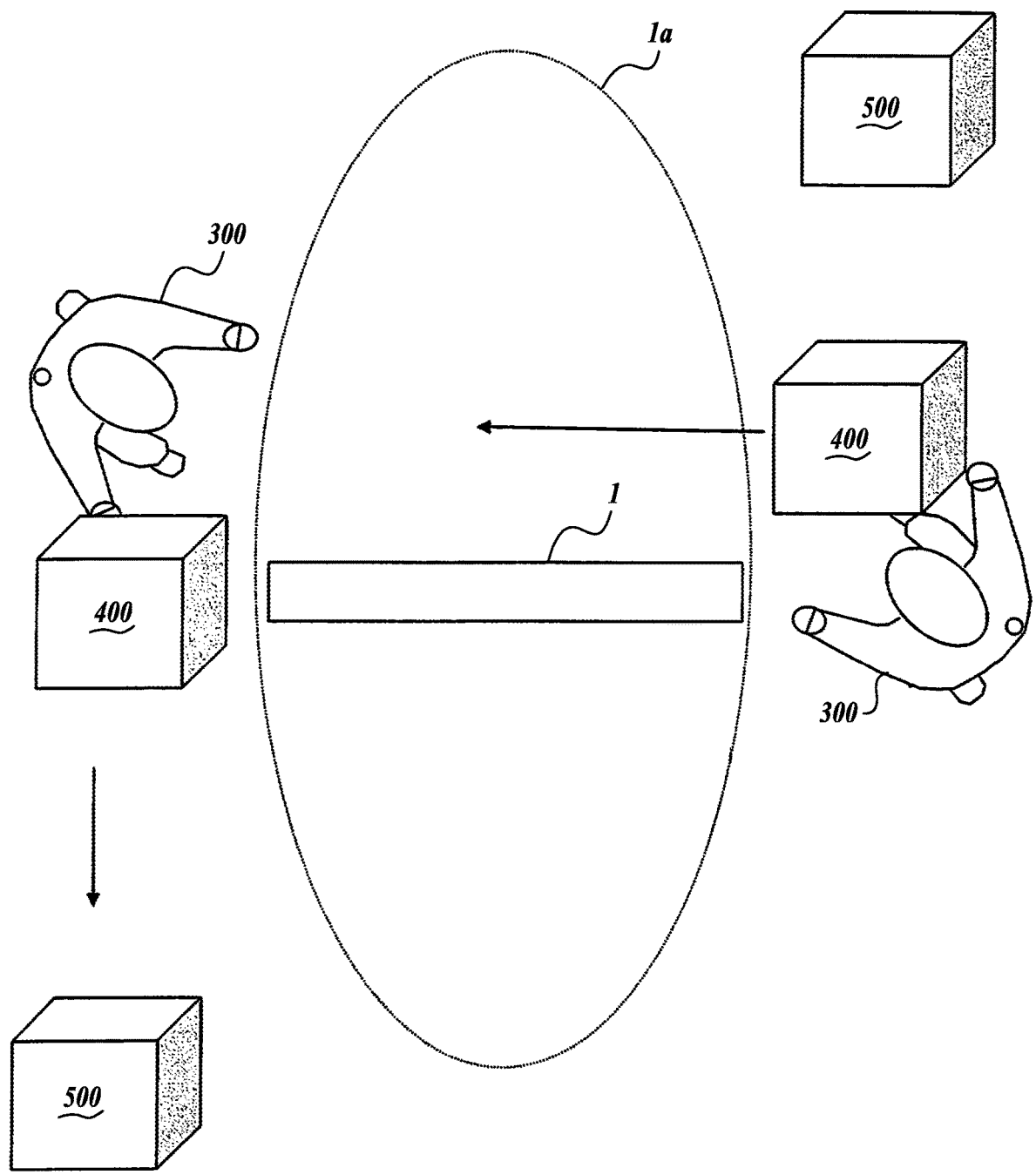
FIG. 6 is an illustration of a strategy for screening laundry bags, bedding, cans, or other objects by sliding them across the floor past the zone of sensitivity.

A common way to move contraband into or around a prison is to put it into laundry bags. To prevent this, laundry bags 400 can be passed one a time through the zone of sensitivity as shown in FIG. 6. To speed up the process, they can be slid along the floor from one prison guard 300 to another prison guard 300. To increase the size of the zone of sensitivity at the floor level the pole can be laid on its side, but it could also be used upright. The strategy will discover contraband in the laundry.

Strategy 5—Sleep Mat and Bedding Screening

This strategy is the same as Strategy 4 but instead of passing across laundry bags, the bedding 500 in a cell is rolled up by an inmate or guard and passed through the zone of sensitivity by sliding along the floor or by an inmate carrying it through the zone. The strategy will discover contraband in the bedding.

Strategy 6—Ad Hoc Screening of Incoming Goods

This strategy is the same as strategy 4 but instead of screening laundry bags, any other items coming into the prison are screened. Examples include tins of food or drink, within which it has been known to hide contraband.

A mix of the strategies can be used, helping introduce higher levels of confusion amongst inmates which increases the chances of detecting contraband.

While illustrative embodiments have been illustrated and described, it will be appreciated that various changes can be made therein without departing from the spirit and scope of the disclosure.

The embodiments of the invention in which an exclusive property or privilege is claimed are defined as follows:

1. A portable security screening installation system for use in a controlled environment comprising:
   a passive detector apparatus which does not produce a magnetic field for detection and relies on detecting changes in earth magnetic field, the apparatus comprising a single elongated portable housing that encloses a battery, wherein the apparatus is battery-powered,
   wherein the housing supports:
      at least two magnetic sensors that are arranged on two opposite sides of the elongated housing and that define a gradiometer which is arranged to produce a signal indicative of the earth magnetic field and a gradient over a zone of sensitivity which extends away from the housing, wherein the zone is configured to contain a whole body of a person, and a signal processing circuit configured to receive as an input the signal from the gradiometer and, in response to a change in the signal, to produce an alert signal wherein the elongated housing is configured to be set up in an upright position in a base.

2. The system of claim 1, wherein a wall or other object behind which the apparatus is hidden is permeable to a magnetic field.

3. The system of claim 2, in which the wall or object is located within a controlled environment.

4. The system of claim 2, further comprising a remote alarm unit, that is located away from the housing on a side of the wall that is opposite from the apparatus.

5. The system of claim 1, further comprising a protective case into which the apparatus is packed.

6. The system of claim 5, wherein the apparatus is operable between the packed state and the ready to use state in less than 30 seconds.

7. The system of claim 1, wherein the apparatus is configured to withstand being pushed or pulled over in use without causing damage to the operation of the device.

8. The system of claim 1, further comprising a wall or other object behind which the apparatus is hidden, the apparatus being positioned so that at least part of the zone of sensitivity extends in front of the wall or other object.

* * * * *